United States Patent
Watanabe et al.

(10) Patent No.: US 10,653,024 B2
(45) Date of Patent: May 12, 2020

(54) DOOR OPENING AND CLOSING MECHANISM

(71) Applicant: MEIDENSHA CORPORATION, Tokyo (JP)

(72) Inventors: Kunihiko Watanabe, Yokohama (JP); Akihiko Kodama, Ota (JP); Noboru Shiozawa, Setagaya-ku (JP); Makoto Miwa, Haibara-gun (JP); Shigenori Ikeda, Makinohara (JP)

(73) Assignee: MEIDENSHA CORPORATION, Tokyo (JP)

( * ) Notice: Subject to any disclaimer, the term of this patent is extended or adjusted under 35 U.S.C. 154(b) by 0 days.

(21) Appl. No.: 16/303,718

(22) PCT Filed: May 23, 2017

(86) PCT No.: PCT/JP2017/019201
§ 371 (c)(1),
(2) Date: Nov. 21, 2018

(87) PCT Pub. No.: WO2017/204216
PCT Pub. Date: Nov. 30, 2017

(65) Prior Publication Data
US 2019/0364678 A1    Nov. 28, 2019

(30) Foreign Application Priority Data

May 24, 2016 (JP) ................................ 2016-103786
May 19, 2017 (JP) ................................ 2017-100093

(51) Int. Cl.
*H05K 5/02* (2006.01)
*H05K 5/03* (2006.01)

(52) U.S. Cl.
CPC ......... *H05K 5/0217* (2013.01); *H05K 5/0239* (2013.01); *H05K 5/03* (2013.01)

(58) Field of Classification Search
CPC ....... H05K 5/0217; H05K 5/0239; H05K 5/03
See application file for complete search history.

(56) References Cited

U.S. PATENT DOCUMENTS

| 9,110,640 B2 * | 8/2015 | Lin ......................... G06F 1/183 |
| 2006/0132006 A1 * | 6/2006 | Schluter ............... H05K 5/0226 |
| | | 312/323 |
| 2016/0255421 A1 * | 9/2016 | Farrar ..................... H04Q 9/00 |
| | | 340/870.07 |

FOREIGN PATENT DOCUMENTS

| JP | 62-94687 U | 6/1987 |
| JP | 5-327234 A | 12/1993 |

(Continued)

*Primary Examiner* — Adrian S Wilson
(74) *Attorney, Agent, or Firm* — Foley & Lardner LLP

(57) ABSTRACT

A door opening and closing mechanism includes: a door configured to open and close a front side opening of a housing, wherein an electronic device is housed in the housing and is exposed through the front side opening; and an accommodation mechanism configured to accommodate the door in the housing when the door is in open state. The accommodation mechanism includes: an opening and closing action unit configured to cause an opening action and a closing action of the door; and a retracting action unit configured to retract the opening and closing action unit into the housing so as to accommodate the door in the housing, when the door is brought in open state by the opening and closing action unit.

14 Claims, 9 Drawing Sheets

(56) References Cited

FOREIGN PATENT DOCUMENTS

| JP | 11-343765 A | 12/1999 |
| JP | 2000-183558 A | 6/2000 |
| JP | 2004-332391 A | 11/2004 |
| JP | 2009-127346 A | 6/2009 |

\* cited by examiner

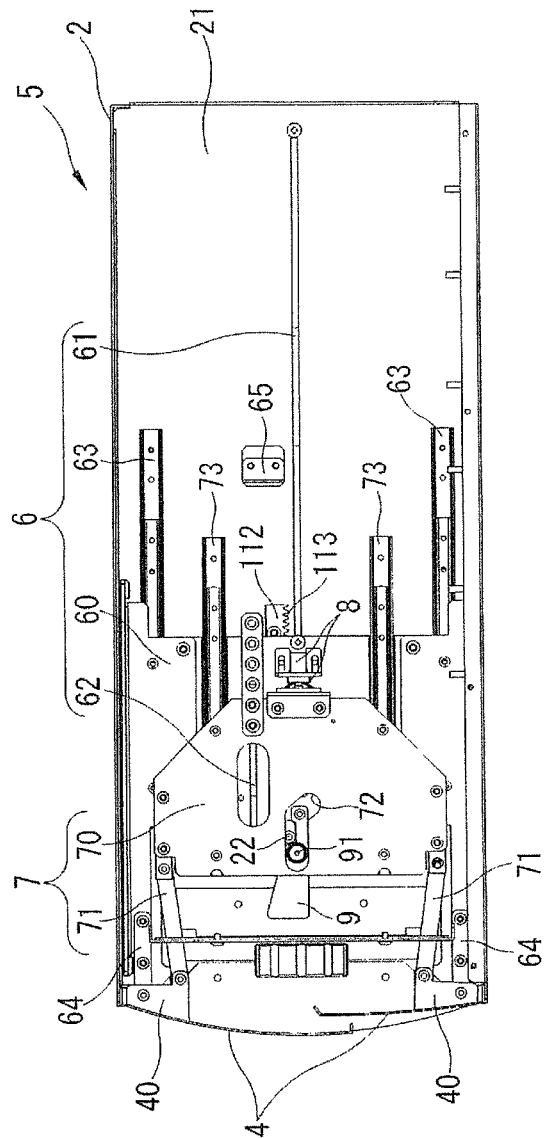
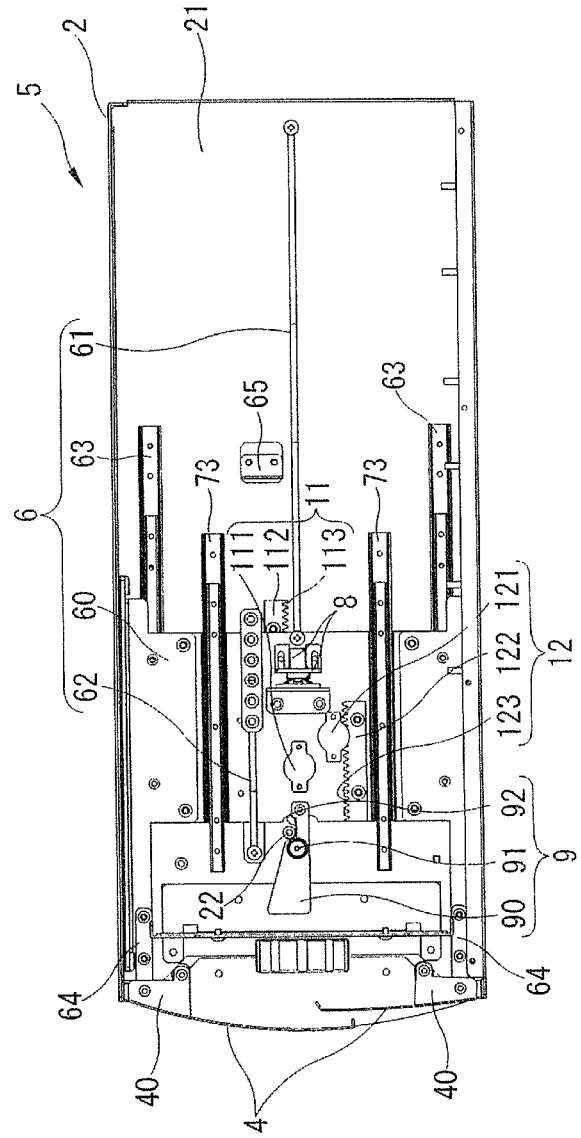

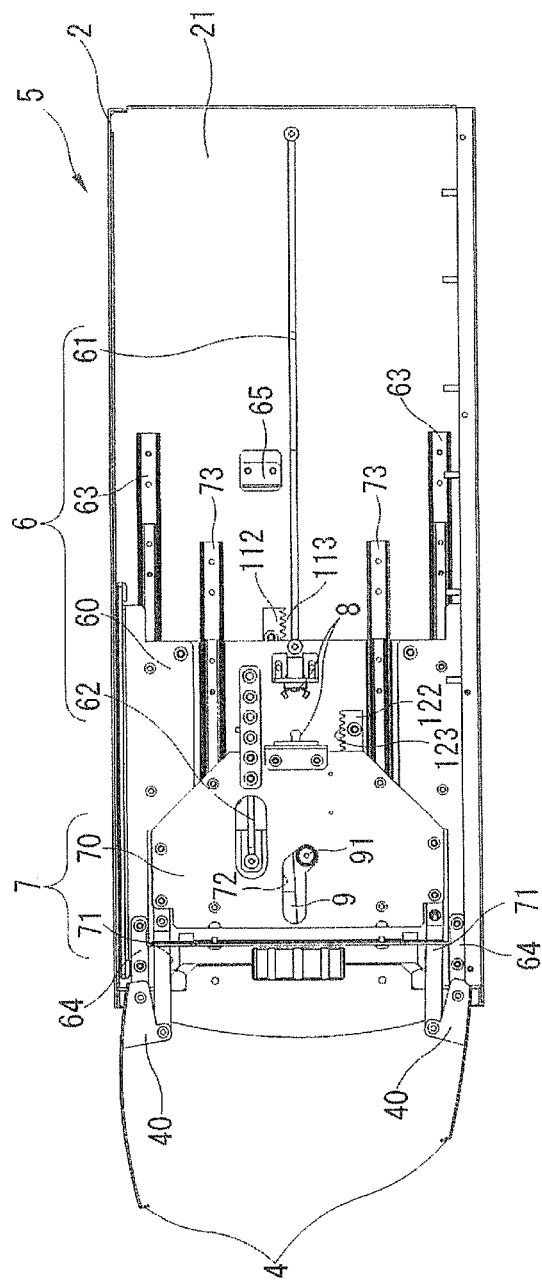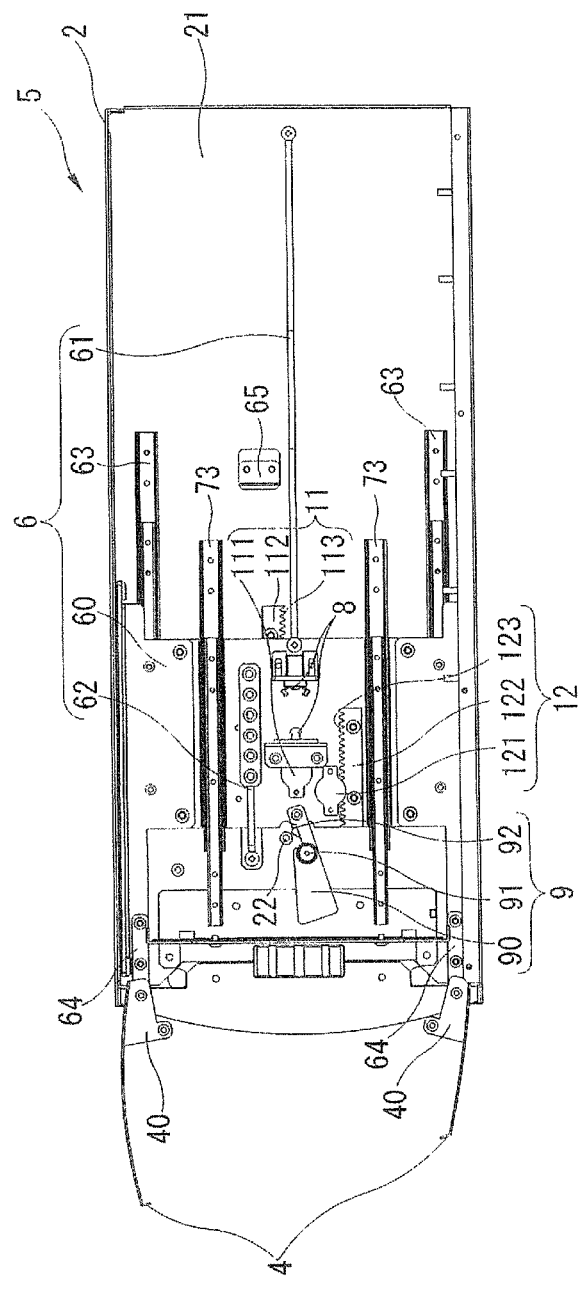

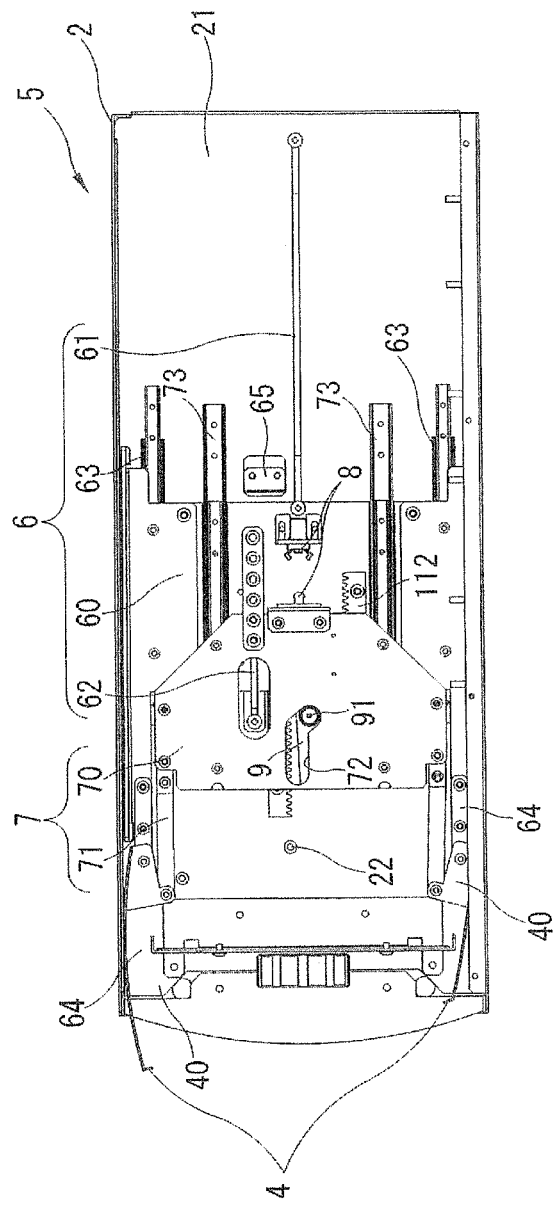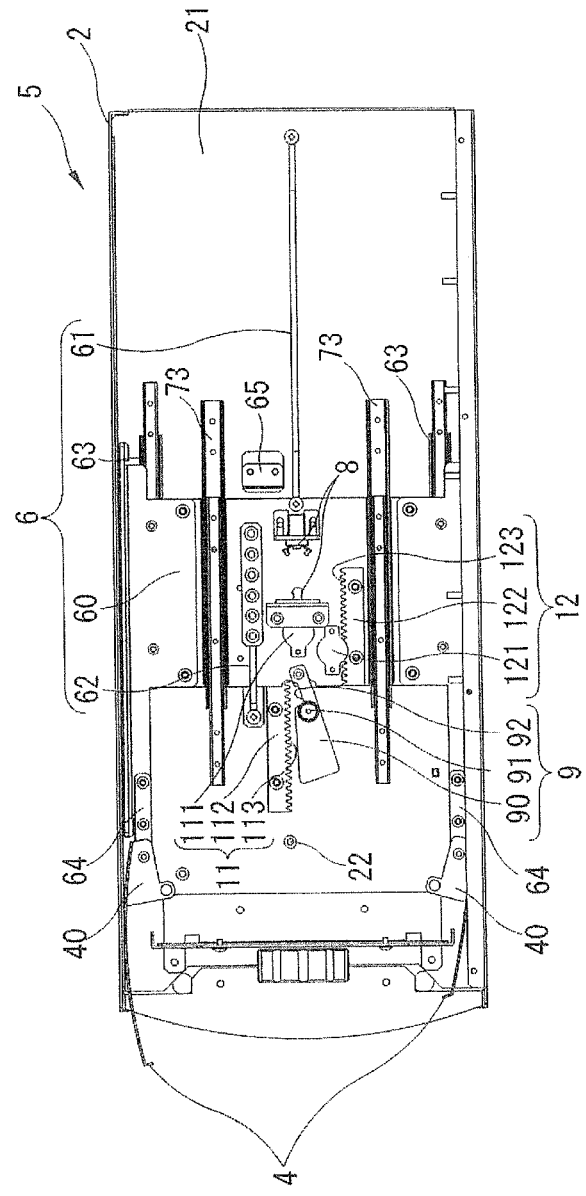
FIG. 5A
FIG. 5B

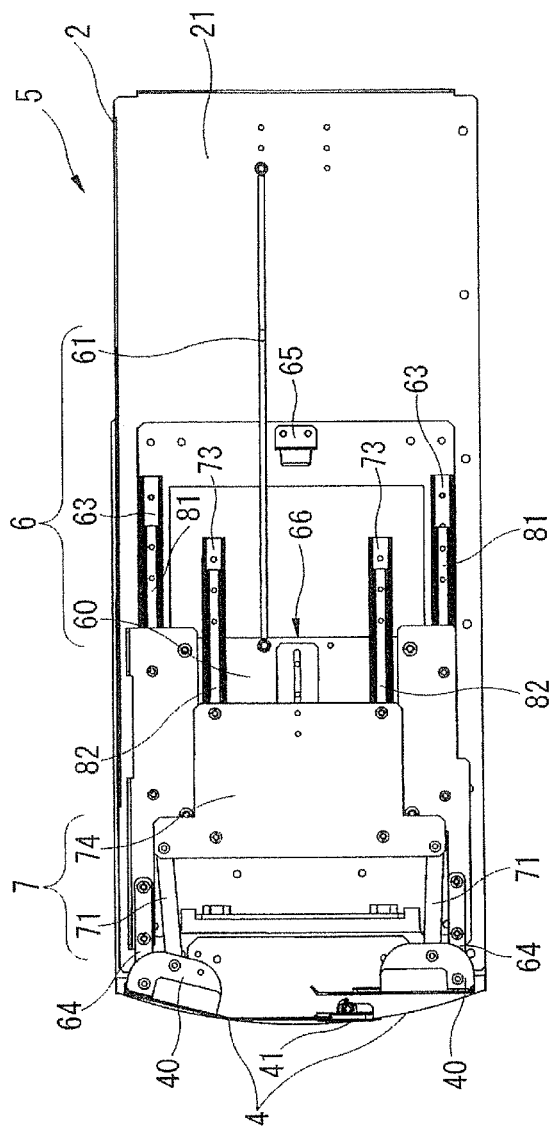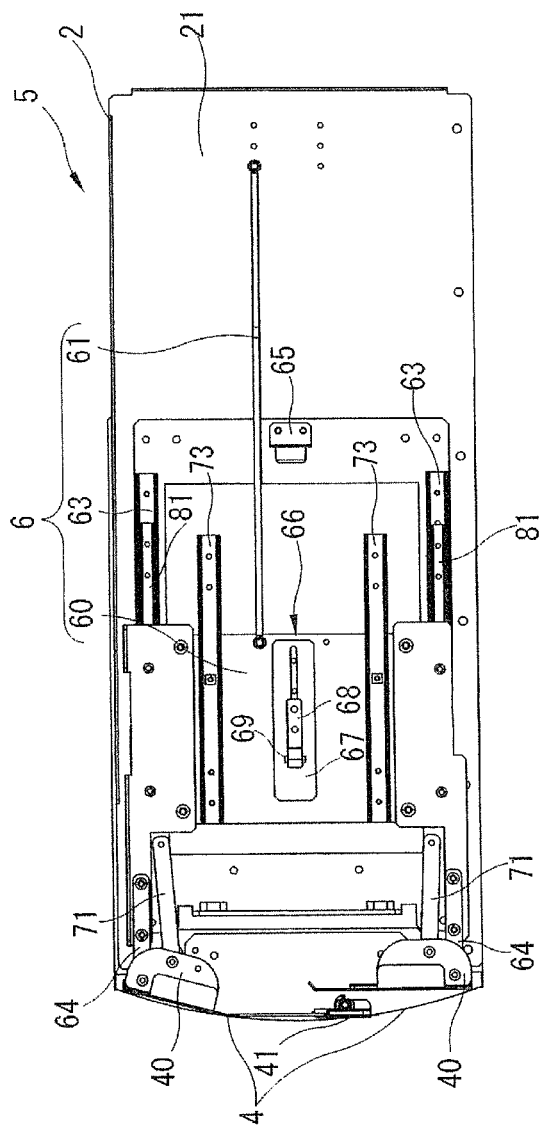

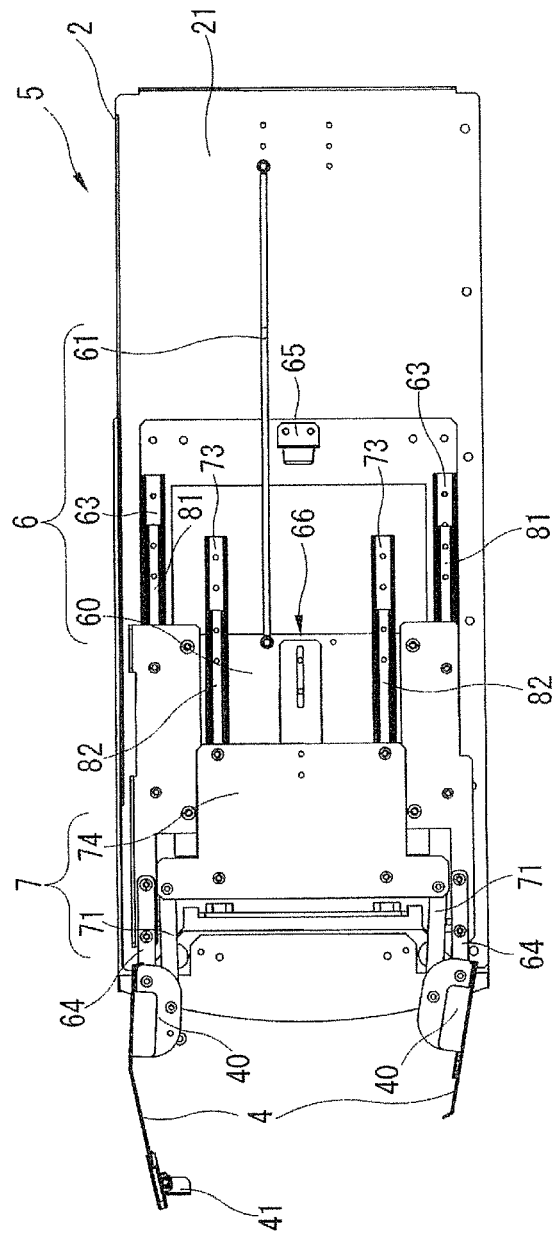
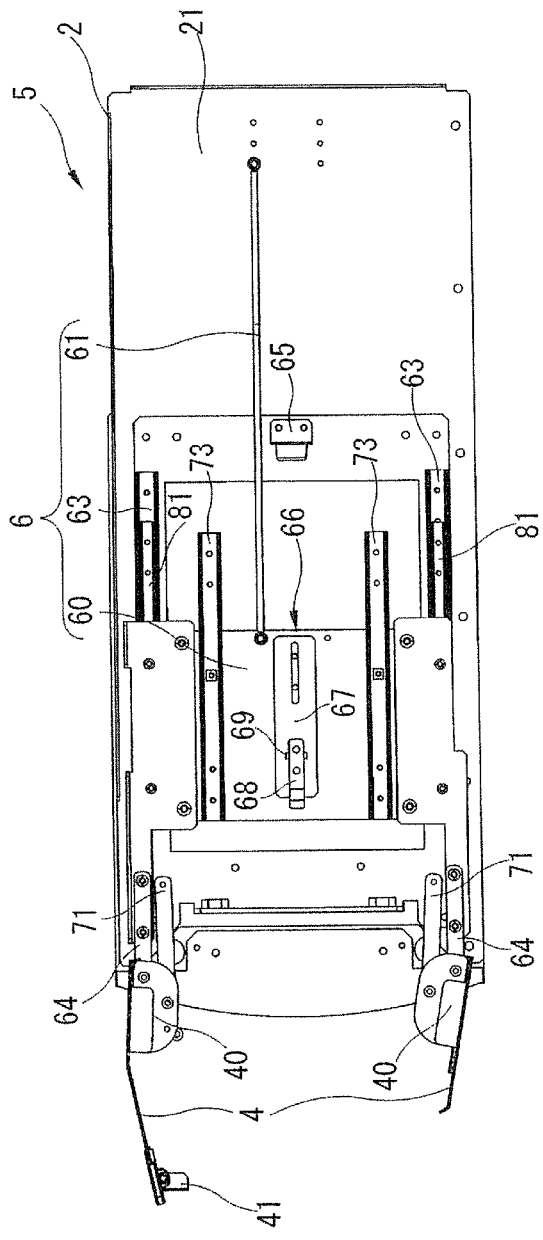
FIG. 8A
FIG. 8B

DOOR OPENING AND CLOSING MECHANISM

TECHNICAL FIELD

The present invention relates to a door opening and closing mechanism for a door for opening and closing a front side part of a housing accommodating an electronic device.

BACKGROUND ART

Patent documents 1 and 2 disclose door opening and closing mechanisms for opening and closing a front side part of a housing accommodating an electronic device, and thereby exposing and covering the electronic device.

Patent document 1 discloses a door opening and closing mechanism including a door that is rotated by a pair of rotating shafts to expose and cover an electronic device accommodated in a housing, wherein the rotating shafts are pivotally supported at places close to end portions of a lower side periphery of a front side opening of the housing.

Patent document 2 discloses a door opening and closing mechanism including a door that is rotated in a horizontal plane or in a vertical plane via a hinge to expose and cover an electronic device accommodated in a housing, wherein a peripheral part of a front side opening of the housing is provided with the hinge.

PRIOR ART DOCUMENT(S)

Patent Document(s)

Patent Document 1: Japanese Patent Application Publication No. H05-327234
Patent Document 2: Japanese Patent Application Publication No. 2000-183558

SUMMARY OF INVENTION

Each conventional door opening and closing mechanism allows the electronic device to be operated and maintained without removal of the door from the housing, because the electronic device is exposed through the front side opening of the housing by setting the door in open state.

However, when the door is opened, each conventional door opening and closing mechanism is in a state where the door projects from the front side part of the housing. The projecting door may obstruct operation and maintenance of the electronic device physically.

In view of the foregoing, it is an object of the present invention to enhance accessibility to an electronic device exposed from a housing when a door is in open state.

According to one aspect of the present invention, a door opening and closing mechanism comprises: a door configured to open and close a front side opening of a housing, wherein an electronic device is housed in the housing and is exposed through the front side opening; and an accommodation mechanism configured to accommodate the door in the housing when the door is in open state.

According to another aspect of the present invention, the accommodation mechanism includes: an opening and closing action unit configured to cause an opening action and a closing action of the door; and a retracting action unit configured to retract the opening and closing action unit into the housing so as to accommodate the door in the housing, when the door is brought in open state by the opening and closing action unit.

According to another aspect of the present invention, the retracting action unit includes: a first body mounted in the housing, and configured to travel forward and rearward in a longitudinal direction of the housing; a pulling member being extensible and contractible and configured to pull the first body rearward of the housing under a condition that the pulling member is connected to an inside of the housing; and an action regulation part configured to regulate action of the opening and closing action unit.

According to another aspect of the present invention, the opening and closing action unit includes: a second body, wherein an action of the second body in the longitudinal direction is regulated by the action regulation part under a condition that the second body is mounted to the first body and configured to travel forward and rearward in the longitudinal direction with respect to the first body; and a connecting member configured to be caused by movement of the second body to open and close the door under a condition that the connecting member is pivotally connected to the second body and the door.

According to another aspect of the present invention: the action regulation part includes: an action regulation board mounted to the first body; and an engaging part configured to engage with the action regulation board under a condition that the second body is provided with the engaging part; the action regulation board is formed with a hole in which the engaging part is configured to engage; the engaging part is configured to engage in the hole when the door is in closed state; and the engaging part is configured to engage with a front side end portion of the action regulation board when the door is in open state.

According to another aspect of the present invention: an inner surface of the housing is provided with a first guide part, wherein the first guide part is configured to guide a guide-target part of the first body in the longitudinal direction, wherein viscous fluid is filled between the guide-target part of the first body and the first guide part for speed reduction of action of the first body in the longitudinal direction; and the first body is provided with a second guide part, wherein the second guide part is configured to guide a guide-target part of the second body in the longitudinal direction, wherein viscous fluid is filled between the guide-target part of the second body and the second guide part for speed reduction of action of the second body in the longitudinal direction.

According to another aspect of the present invention, the retracting action unit includes: a first body mounted in the housing, and configured to travel forward and rearward in a longitudinal direction of the housing; a first pulling member being extensible and contractible and configured to pull the first body rearward of the housing under a condition that the first pulling member is connected to an inside of the housing; and a second pulling member being extensible and contractible and configured to pull the opening and closing action unit forward of the housing under a condition that the second pulling member is connected to first body.

According to another aspect of the present invention, the opening and closing action unit includes: a second body connected to the second pulling member under a condition that the second body is mounted to the first body and configured to travel forward and rearward in the longitudinal direction with respect to the first body; and a connecting member configured to be caused by movement of the second body to open and close the door under a condition that the connecting member is pivotally connected to the second body and the door.

According to another aspect of the present invention, the door opening and closing mechanism further comprises a first speed reduction mechanism configured to reduce speed of action of the first body.

According to another aspect of the present invention, the first speed reduction mechanism includes: a first rotary speed reduction part provided at the first body; and a first receiving part formed with a toothed surface that extends in the longitudinal direction, and is configured to mesh with the first rotary speed reduction part under a condition that the first receiving part is provided at an inside of the housing.

According to another aspect of the present invention, the door opening and closing mechanism further comprises a second speed reduction mechanism configured to reduce speed of action of the second body.

According to another aspect of the present invention, the second speed reduction mechanism includes: a second rotary speed reduction part provided at the second body; and a second receiving part formed with a toothed surface that extends in the longitudinal direction, and is configured to mesh with the second rotary speed reduction part under a condition that the second receiving part is provided at the first body.

According to another aspect of the present invention, the door opening and closing mechanism further comprises a pair of couplers configured to couple the retracting action unit with the opening and closing action unit under a condition that the door is in closed state, wherein the retracting action unit is provided with a first one of the couplers, the opening and closing action unit is provided with a second one of the couplers, and the first coupler is configured to be attached to and detached from the second coupler by receipt of pressure from the second coupler.

According to another aspect of the present invention, the door opening and closing mechanism further comprises an engaging member configured to: engage the first body with an inside of the housing when the first body arrives at a forward travel end position in the longitudinal direction; and disengage the first body from the inside of the housing when the second body arrives at a position where the door is in open state.

According to another aspect of the present invention, the door is provided for each of upper and lower sides of the front side opening of the housing.

According to another aspect of the present invention: the door is provided for each of upper and lower sides of the front side opening of the housing; and the door for the upper side includes a lower peripheral part where a knob part rotatably provided.

The present invention described above serves to enhance accessibility to an electronic device exposed from a housing when a door is in open state.

BRIEF DESCRIPTION OF DRAWINGS

FIG. 3A is a side view of the door opening and closing mechanism when the doors are closed. FIG. 3B is a side view of the door opening and closing mechanism in a state where a second body of an opening and closing action unit is removed.

FIG. 4A is a side view of the door opening and closing mechanism when the doors are opened. FIG. 4B is a side view of the door opening and closing mechanism in the state where the second body is removed.

FIG. 5A is a side view of the door opening and closing mechanism when the doors are accommodated in the housing. FIG. 5B is a side view of the door opening and closing mechanism in the state where the second body is removed.

FIG. 7A is a side view of the door opening and closing mechanism according to the second embodiment when the doors are closed. FIG. 7B is a side view of the door opening and closing mechanism according to the second embodiment in a state where a second body of an opening and closing action unit is removed.

FIG. 8A is a side view of the door opening and closing mechanism according to the second embodiment when the doors are opened. FIG. 8B is a side view of the door opening and closing mechanism according to the second embodiment in the state where the second body is removed.

MODE(S) FOR CARRYING OUT THE INVENTION

The following describes embodiments of the present invention with reference to the drawings.

First Embodiment

Figure 1A:
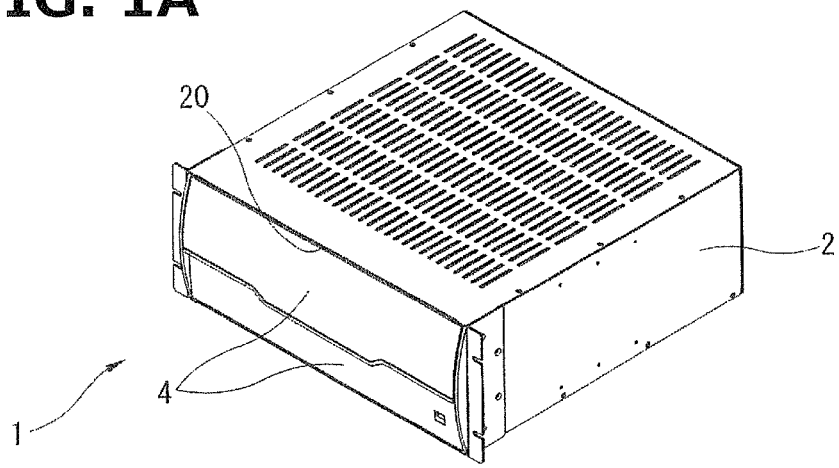
FIG. 1A is a perspective view of a housing provided with a door opening and closing mechanism according to a first embodiment of the present invention.
Figure 1B:
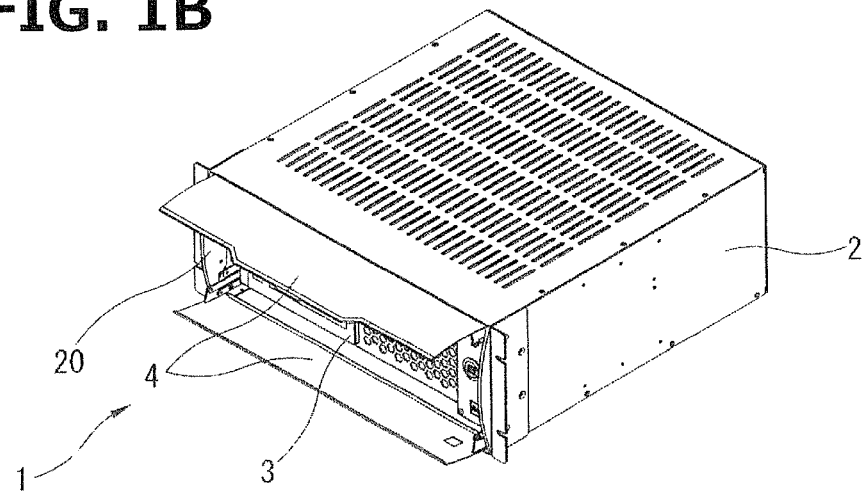
FIG. 1B is a perspective view of the housing when doors are opened.
Figure 1C:
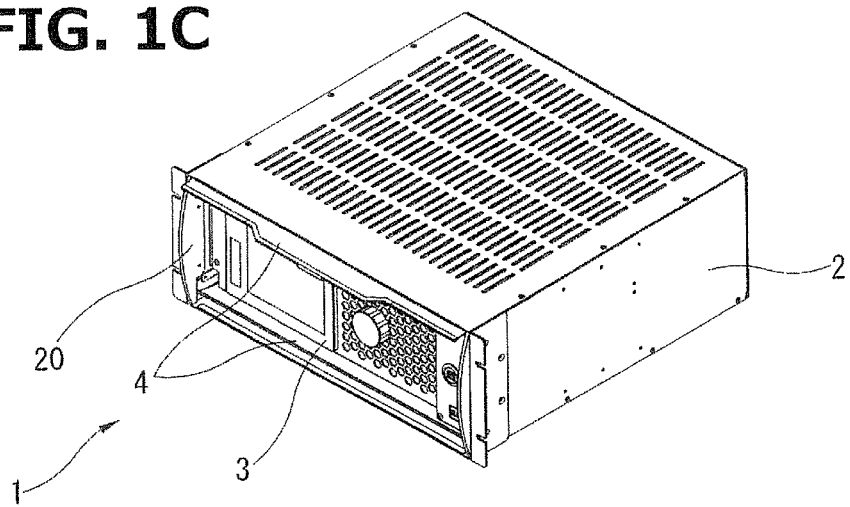
FIG. 1C is a perspective view of the housing when the opened doors are accommodated in the housing.
Figure 2:
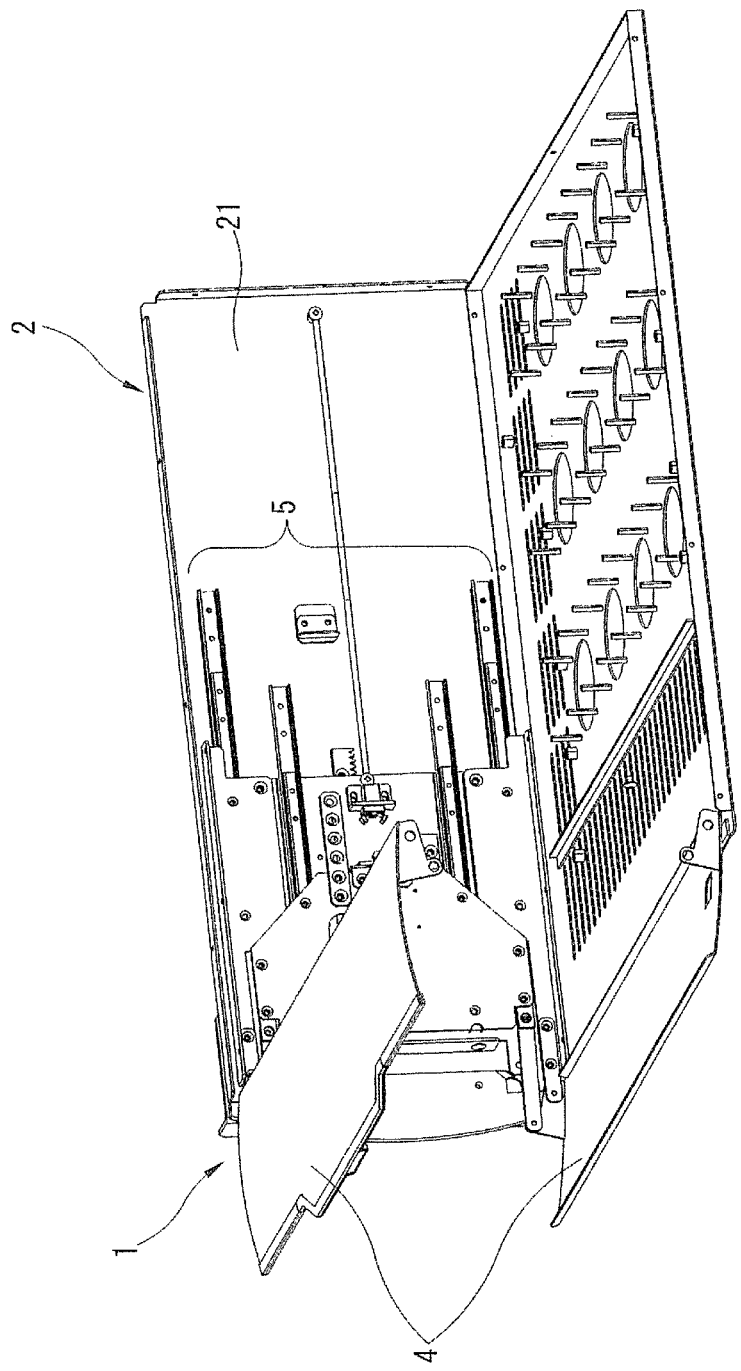
FIG. 2 is a perspective view of the door opening and closing mechanism.

FIGS. 1 and 2 show a door opening and closing mechanism according to a first embodiment, which includes: doors 4 configured to open and close a front side opening 20 of a housing 2, wherein an electronic device 3 is housed in the housing 2 and is exposed through the front side opening 20; and an accommodation mechanism 5 configured to accommodate the doors 4 in the housing 2 when the doors 4 are in open state. The doors 4 are provided in pairs at the front side opening 20 of the housing 2. On the other hand, the accommodation mechanism 5 is provided for each of inner lateral surfaces (inner surfaces) 21 of the housing 2 which face each other.

<Example of Configuration of Accommodation Mechanism 5> As shown in FIGS. 3 to 5, the accommodation mechanism 5 includes a retracting action unit 6 and an opening and closing action unit 7.

The retracting action unit 6 is configured to retract the opening and closing action unit 7 into the housing 2 under a condition that the doors 4 are opened by the opening and closing action unit 7, and thereby accommodate the doors 4 in the housing 2.

<Example of Configuration of Retracting Action Unit 6> The retracting action unit 6 includes a first body 60, a first pulling member 61, and a second pulling member 62.

The first body 60 is mounted in the housing 2, and configured to travel forward and rearward in a longitudinal direction of the housing 2. The first body 60 is connected to connecting members 64, wherein each connecting member 64 is pivotally connected to a support part 40 of the corresponding door 4.

One inner lateral surface 21 of the housing 2 is provided with a pair of first guide parts 63 for guiding the first body 60 in the longitudinal direction, and a contact part 65 for stopping the first body 60 that has traveled rearward.

The first pulling member 61 is configured to pull the first body 60 rearward of the housing 2 under a condition that the first pulling member 61 is connected to an inside of the housing 2. On the other hand, the second pulling member 62 is configured to pull the opening and closing action unit 7 forward of the housing 2 under a condition that the opening and closing action unit 7 is connected to the first body 60. Each of the first pulling member 61 and the second pulling member 62 is an elastic member such as a coil spring, which is mounted so as to be extensible and contractible and have adjustable tension.

<Example of Configuration of Opening and Closing Action Unit 7> The opening and closing action unit 7 includes a second body 70 and connecting members 71.

The second body 70 is connected to the second pulling member 62 under a condition that the second body 70 is mounted to the first body 60 and configured to travel forward and rearward in the longitudinal direction of the housing 2 with respect to the first body 60. Accordingly, the first body 60 is provided with a pair of second guide parts 73 configured to guide the second body 70 in the longitudinal direction.

Each connecting member 71 is configured to be caused by movement of the second body 70 to open and close the corresponding door 4 under a condition that the connecting member 71 is pivotally connected to the second body 70 and the support part 40 of the door 4.

<Example of Configuration of First Speed Reduction Mechanism 11> The door opening and closing mechanism 1 further includes a first speed reduction mechanism 11 configured to reduce speed of action of the first body 60.

The first speed reduction mechanism 11 includes: a first rotary speed reduction part 111 provided at the first body 60; and a first receiving part 112 formed with a toothed surface 113 that extends in the longitudinal direction, and is configured to mesh with the first rotary speed reduction part 111 under a condition that the first receiving part 112 is provided at an inside of the housing 2.

For example, the first rotary speed reduction part 111 is implemented by a publicly-known rotary damper, whereas the first receiving part 112 is implemented by a publicly-known pinion rack configured to mesh with the rotary damper.

<Example of Configuration of Second Speed Reduction Mechanism 12> The door opening and closing mechanism 1 further includes a second speed reduction mechanism 12 configured to reduce speed of action of the second body 70.

The second speed reduction mechanism 12 includes: a second rotary speed reduction part 121 provided at the second body 70; and a second receiving part 122 formed with a toothed surface 123 that extends in the longitudinal direction, and is configured to mesh with the second rotary speed reduction part 121 under a condition that the second receiving part 122 is provided at the first body 60.

The second rotary speed reduction part 121 and the second receiving part 122 are implemented by a publicly-known rotary damper and a publicly-known pinion rack, respectively, similar to the first speed reduction mechanism 11.

<Example of Configuration of Couplers 8> As shown in FIG. 3, the door opening and closing mechanism 1 further includes a pair of couplers 8 configured to couple the retracting action unit 6 with the opening and closing action unit 7 under a condition that the doors 4 are in closed state.

The retracting action unit 6 (first body 60) is provided with a first one of the couplers 8, and the opening and closing action unit 7 (second body 70) is provided with a second one of the couplers 8, wherein the first coupler 8 is configured to be attached to and detached from the second coupler 8 by receipt of pressure from the second coupler 8. For example, the couplers 8 are implemented by a publicly-known device of a push latch type.

<Example of Configuration of Engaging Member 9> The door opening and closing mechanism 1 further includes an engaging member 9 configured to: engage the first body 60 with an inside of the housing 2 when the first body 60 arrives at a forward travel end position in the longitudinal direction; and disengage the first body 60 from the inside of the housing 2 when the second body 70 of the opening and closing action unit 7 arrives at a position where the doors 4 are in open state.

The inner lateral surface 21 of the housing 2 is formed with an engagement-target part 22, wherein the engagement-target part 22 projects from the inner lateral surface 21, and is configured to engage with an engaging body 90 of the engaging member 9.

As shown in FIG. 3B, the engaging body 90 of the engaging member 9 is formed of a steel plate material, and is pivotally connected to the first body 60 under a condition that the engaging body 90 projects forward from the first body 60. The engaging body 90 is formed with: a guide-target part 91 configured to be in contact with and guided by the second body 70 when the engagement is canceled; and a recess 92 configured to engage with the engagement-target part 22.

On the other hand, the second body 70 is formed with a guide hole 72 configured to guide the guide-target part 91 so as to cancel the engagement when the second body 70 arrives at the position where the doors 4 are in open state.

<Example of Action of Door Opening and Closing Mechanism 1 in First Embodiment> The following describes an example of action of the door opening and closing mechanism 1 with reference to FIGS. 1 and 3 to 5.

First, the following describes an example of action of the door opening and closing mechanism 1 when the closed doors 4 are brought into open state.

When the outermost one of the pair of doors 4 in the closed state shown in FIG. 1A is pushed, the support part 40 for each of the pair of doors 4 shown in FIGS. 3A and 3B swings inward of the housing 2. The swinging of the support part 40 causes the connecting member 71 of the opening and closing action unit 7 to cause the second body 70 to travel rearward. In this situation, the second body 70 is guided by the second guide parts 73 on the first body 60 of the retracting action unit 6, and travels rearward under a condition that the speed of travel is reduced by the second rotary speed reduction part 121 of the second speed reduction mechanism 12. This causes the first coupler 8 at the retracting action unit 6 to cancel the coupling with the second coupler 8 at the opening and closing action unit 7 by receipt of pressure from the second coupler 8. Upon the cancellation of the coupling, as shown in FIGS. 4A and 4B, the second body 70 is pulled by a contracting force of the second pulling member 62 to travel forward under a condition that the second body 70 is guided by the second guide parts 73 and decelerated by the second rotary speed reduction part 121. This forward travel of the second body 70 causes each connecting member 71 to cause the support part 40 of the corresponding one of the pair of doors 4 to swing forward. In this situation, the pair of doors 4 are brought into open state, as shown in FIGS. 1B, 4A and 4B. When the second body 70 of the opening and closing action unit 7 arrives at this position where the doors 4 are in open state, the guide hole 72 of the second body 70 is brought into contact with the guide-target part 91 of the engaging member 9 so as to cancel the engagement of the recess 92 of the engaging member 9 with the engagement-target part 22 at the inside of the housing 2. Upon the cancellation of the engagement, the first body 60 is pulled by a contracting force of the first pulling member 61 to travel rearward under a condition that the first body 60 is guided by the first guide parts 63 and is decelerated by the first rotary speed reduction part 111. Then, the first body 60 is stopped by contact with the contact part 65. In this situation, the second body 70 of the opening and closing action unit 7 is retracted further into the housing 2, so that the pair of doors 4 are accommodated in the housing 2, as shown in FIGS. 1C, 5A and 5B.

The following describes an example of action of the door opening and closing mechanism 1 when the doors 4 in open state are brought into closed state.

A peripheral part of a first one of the pair of doors 4 in the open state shown in FIGS. 1C, 5A and 5B, wherein the first door 4 projects slightly from the front side opening 20 of the housing 2, is pulled out forward. In this situation, the first body 60 is pulled by the connecting members 64 connected to the support parts 40 of the doors 4, so as to travel forward while being guided by the first guide parts 63. When the first body 60 arrives at the forward travel end position, the recess 92 of the engaging member 9 engages with the engagement-target part 22 at the inside of the housing 2 under a condition that the first pulling member 61 is extended. On the other hand, the second body 70 is caused by an extending force of the second pulling member 62 to travel rearward under a condition that the second body 70 is guided by the second guide parts 73 and decelerated by the second rotary speed reduction part 121. This rearward travel of the second body 70 causes the first coupler 8 at the retracting action unit 6 to receive pressure from the second coupler 8 at the opening and closing action unit 7, and thereby be coupled with the second coupler 8, as shown in FIGS. 3A and 3B. In this situation, the pair of doors 4 are brought into closed state, as shown in FIGS. 1A, 3A and 3B.

<Effects of First Embodiment> The door opening and closing mechanism 1 described above serves to allow the opened doors 4 to be accommodated in the housing 2 by the accommodation mechanism 5, and thereby remove physical obstruction from the front side opening of the housing 2, and thereby enhance the accessibility to the electronic device 3 housed in the housing 2, when the electronic device 3 is maintained or operated.

In particular, the accommodation mechanism 5 is configured such that the opening and closing action unit 7 for opening and closing the doors 4 is caused by the retracting action unit 6 to travel forward and rearward in the housing 2. In particular, the first body 60 of the retracting action unit 6 is allowed by the extending force and contracting force of the first pulling member 61 to travel forward and rearward in the longitudinal direction, whereas the second body 70 of the opening and closing action unit 7 is allowed by the extending force and contracting force of the second pulling member 62 to travel forward and rearward in the longitudinal direction. This allows the doors 4 to be opened and closed and accommodated into the housing 2 where no electric power source is required.

The forward and rearward action of the first body 60 is regulated by speed reduction of the first speed reduction mechanism 11, in particular, for the first speed reduction mechanism 11, the forward and rearward action of the first body 60 is regulated by speed reduction under a condition that the first rotary speed reduction part 111 at the first body 60 meshes with the first receiving part 112 at the housing 2. This allows smooth and silent forward and rearward action of the first body 60, and also serves to suppress vibration of the housing 2 when the first body 60 travels forward and rearward.

Furthermore, the forward and rearward action of the second body 70 is regulated by speed reduction of the second speed reduction mechanism 12. In particular, for the second speed reduction mechanism 12, the forward and rearward action of the second body 70 is regulated by speed reduction by meshing of the second rotary speed reduction part 121 of the second body 70 with the second receiving part 122 of the first body 60. This allows smooth and silent forward and rearward action of the second body 70, and also serves to suppress vibration of the first body 60 and the housing 2 when the second body 70 travels forward and rearward.

Then, when the doors 4 are in closed state, the retracting action unit 6 and the opening and closing action unit 7 are coupled together by the pair of couplers 8. In particular, the first coupler 8 at the retracting action unit 6 is capable of being attached to and detached from the second coupler 8 at the opening and closing action unit 7 by receipt of pressure from the second coupler 8. This allows the doors 4 to be opened or closed by one-touch operation of the door 4, and thus allows the doors 4 to be opened or closed easily.

Moreover, the accommodation mechanism 5 is configured such that the engaging member 9 engages the first body 60 with the inside of the housing 2 when the first body 60 arrives at the forward travel end position, whereas this engagement is canceled when the second body 70 arrives at the position where the doors 4 are in open state. This serves to hold the first body 60 stably in the position in the housing 2 which allows the doors 4 to be closed.

As described above, the door opening and closing mechanism 1 according to the present embodiment is superior in operability and appearance.

Second Embodiment

Figure 6:
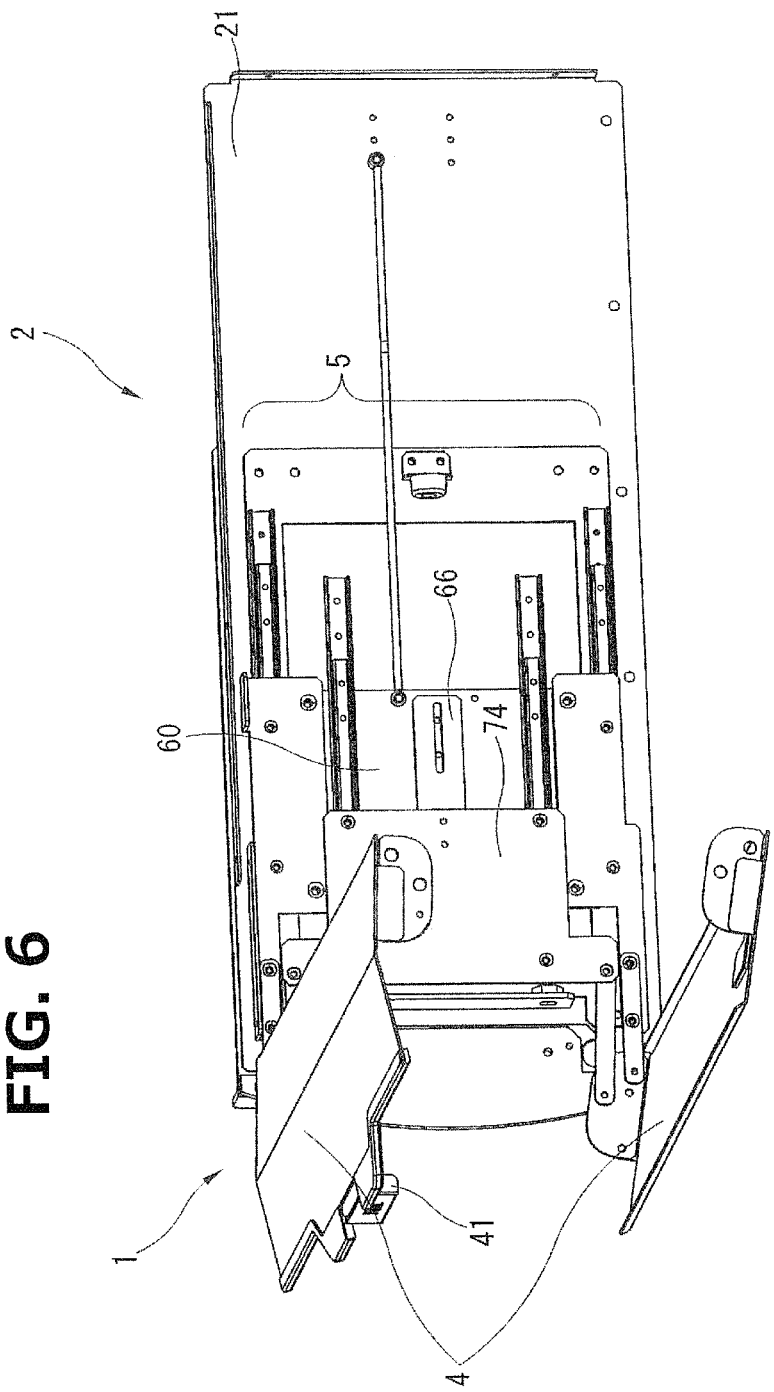
FIG. 6 is a perspective view of a door opening and closing mechanism according to a second embodiment of the present invention.

A door opening and closing mechanism 1 according to a second embodiment includes an accommodation mechanism 5 shown in FIG. 6.

The accommodation mechanism 5 according to the second embodiment is different from the accommodation mechanism 5 according to the first embodiment in that the accommodation mechanism 5 according to the second embodiment does not include the second pulling member 62, the first speed reduction mechanism 11, the second speed reduction mechanism 12, the coupler 8, nor the engaging member 9.

The following describes an example of configuration of the retracting action unit 6 and an example of configuration of the opening and closing action unit 7 with reference to FIGS. 7 to 9, wherein the accommodation mechanism 5 according to the present embodiment includes the retracting action unit 6 and the opening and closing action unit 7.

<Example of Configuration of Retracting Action Unit 6>
As shown in FIGS. 7 to 9, the retracting action unit 6 according to the present embodiment includes an action regulation part 66 instead of the second pulling member 62, and is thereby configured substantially identical to the retracting action unit 6 according to the first embodiment.

The retracting action unit 6 includes: the first body 60 mounted in the housing 2 and configured to travel forward and rearward in the longitudinal direction of the housing 2; the first pulling member 61 being extensible and contractible and connected to an inside of the housing 2 and configured to pull the first body 60 rearward of the housing 2; and the action regulation part 66 described below for regulating the action of the opening and closing action unit 7.

<Example of Configuration of Opening and Closing Action Unit 7> As shown in FIGS. 7 to 9, the opening and closing action unit 7 includes a second body 74 instead of the second body 70, and is thereby configured substantially identical to the opening and closing action unit 7 according to the first embodiment.

The opening and closing action unit 7 includes: the second body 74 mounted to the first body 60 and configured to travel forward and rearward in the longitudinal direction of the housing 2 with respect to the first body 60, wherein action of the second body 74 in the longitudinal direction is regulated by the action regulation part 66; and the connecting members 71, each of which is pivotally connected to the second body 74 and the corresponding door 4, and configured to be caused by movement of the second body 74 to open and close the door 4.

The upper one of the pair of doors 4 according to the present embodiment includes a lower peripheral part to which a knob part 41 is rotatably attached.

<Example of Configuration of Action Regulation Part 66> As shown in FIGS. 7 to 9, the action regulation part 66 includes: an action regulation board 67 mounted to the first body 60; and an engaging part 68 configured to engage with the action regulation board 67 under a condition that the engaging part 68 is provided at the second body 74.

The action regulation board 67 is provided at the first body 60 such that the position of the action regulation board 67 is adjustable in the longitudinal direction of the housing 2.

As shown in FIG. 7B, the action regulation board 67 is formed with a hole 69 in which the engaging part 68 is configured to engage. The engaging part 68 engages in the hole 69 when the doors 4 are in closed state as shown in FIG. 7B. On the other hand, the engaging part 68 engages with a forward end portion of the action regulation board 67 when the doors 4 are in open state as shown in FIG. 8B. For example, the engaging part 68 is implemented by an angled leaf spring.

<Example of Configuration of Action Speed Reduction Mechanisms for First Body 60 and Second Body 74> The second embodiment is also configured to reduce speed of action of the first body 60 and speed of action of the second body 74.

Specifically, the first body 60 includes a pair of first guide-target parts 81 that are configured to be guided in the longitudinal direction of the housing 2 by the pair of first guide parts 63, wherein the first guide parts 63 are mounted to the inner lateral surface 21 of the housing 2. Viscous fluid is filled between the first guide part 63 and the first guide-target part 81 for reducing speed of action of the first body 60 in the longitudinal direction.

The first body 60 includes the pair of second guide parts 73 configured to guide a pair of second guide-target parts 82 in the longitudinal direction, wherein the second guide-target parts 82 are provided at the second body 74. Viscous fluid is filled between the second guide part 73 and the second guide-target part 82 for reducing speed of action of the second body 74 in the longitudinal direction.

The viscous fluid is implemented by grease having a relatively high viscosity, such as damper-use grease or helicoid grease.

<Example of Action of Door Opening and Closing Mechanism 1 in Second Embodiment> The following describes an example of action of the door opening and closing mechanism 1 according to the second embodiment with reference to FIGS. 7 to 9.

First, the following describes an example of action of the door opening and closing mechanism 1 when the closed doors 4 are brought into open state.

When the knob part 41 of the upper one of the pair of doors 4 in the closed state shown in FIGS. 7A and 7B is pulled back by a user's hand, the support part 40 of the upper door 4 is rotated outward of the housing 2 as shown in FIGS. 8A and 8B. The rotation of the support part 40 causes the connecting member 71 of the upper door 4 to cause the second body 74 to travel forward. In this situation, each second guide-target part 82 of the second body 74 travels forward while being guided by the second guide part 73 on the first body 60 of the retracting action unit 6 under a condition that the speed of travel is reduced by the viscous fluid between the second guide part 73 and the second guide-target part 82. On the other hand, the connecting member 71 of the lower door 4 is caused by movement of the second guide-target part 82 of the second body 74 to rotate the support part 40 of the lower door 4 in the outward direction. Furthermore, the engaging part 68 at the second body 74 is released from the hole 69 of the action regulation board 67 of the action regulation part 66 at the first body 60, and thereafter engages with the forward end portion of the action regulation board 67 under a condition that the engaging part 68 is pulled by the contracting force of the first pulling member 61. In this situation, the upper and lower doors 4 are opened as shown in FIGS. 8A and 8B.

When the doors 4 are opened and the knob part 41 is supported by the user's hand, the upper door 4 has an apparent weight substantially equal to zero. In this situation, the first guide-target part 81 of the first body 60 is not applied with the load due to weight. Accordingly, the first guide-target part 81 is guided by the first guide part 63 of the inner lateral surface 21 of the housing 2 and caused by the contracting force of the first pulling member 61 to travel rearward. This rearward movement of the first guide-target part 81 is regulated by speed reduction by the viscous fluid between the first guide-target part 81 and the first guide part 63. Then, when the first body 60 is stopped by contact with the contact part 65, the second body 74 of the opening and closing action unit 7 is further retracted into the housing 2, and the pair of doors 4 are thereby accommodated in the housing 2, as shown in FIGS. 9A and 9B.

The following describes an example of action of the door opening and closing mechanism 1 when the doors 4 in open state are brought into closed state.

Figure 9A:
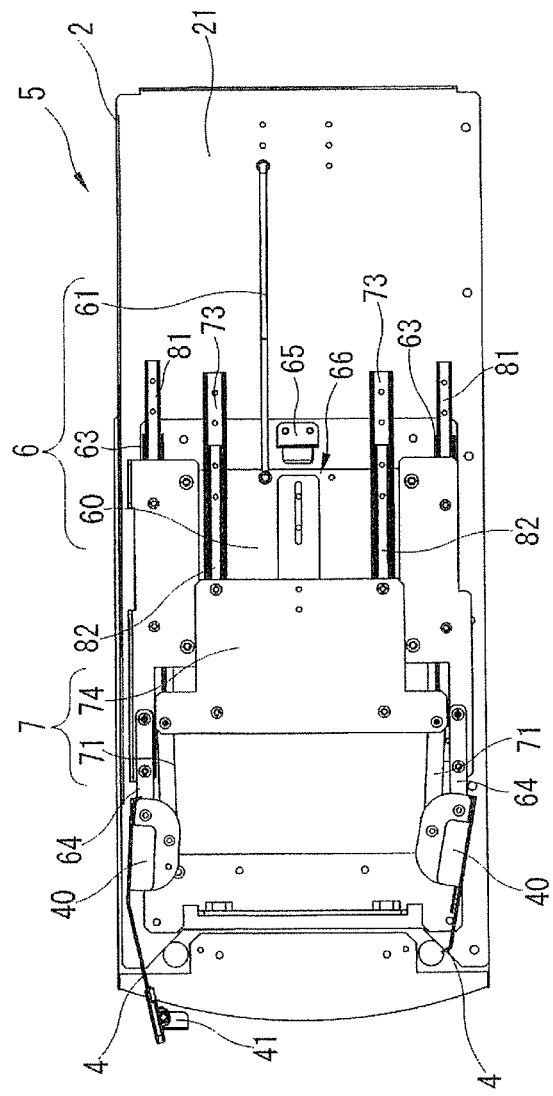
FIG. 9A is a side view of the door opening and closing mechanism according to the second embodiment when the doors are accommodated in the housing.
Figure 9B:
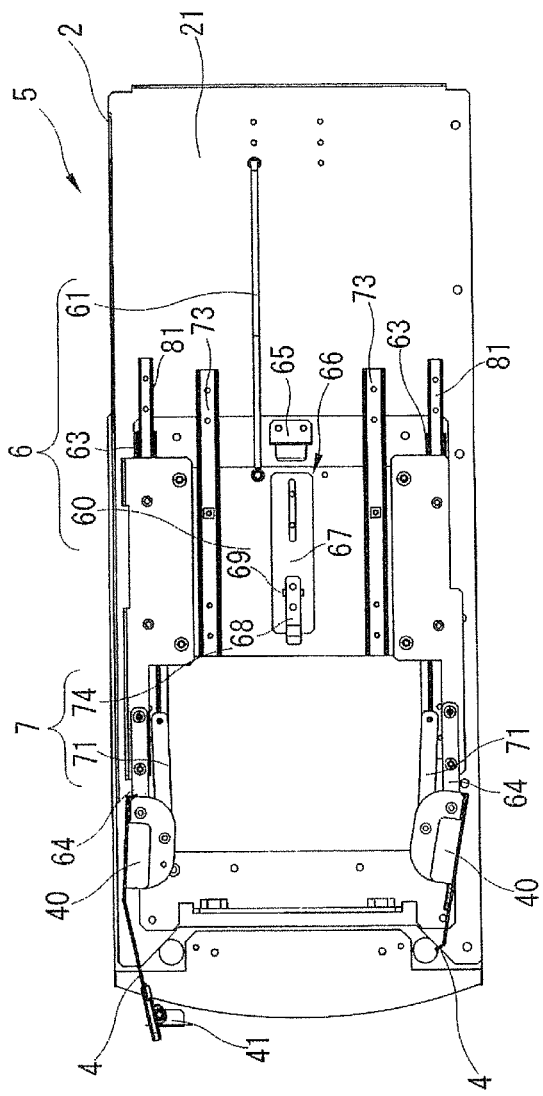
FIG. 9B is a side view of the door opening and closing mechanism according to the second embodiment in the state where the second body is removed.

When the knob part 41 of the upper door 4 is held and drawn back by a user's hand, wherein the knob part 41 is exposed out of the front side opening 20 of the housing 2, as shown in FIGS. 9A and 9B, the upper and lower doors 4 are drawn out of the front side opening 20 as shown in FIGS. 8A and 8B. In this situation, each first guide-target part 81 of the first body 60 travels forward under speed reduction by the viscous fluid between the first guide part 63 and the first guide-target part 81, while being guided by the first guide part 63 and pulled by the connecting member 64 connected to the support part 40 of the door 4.

Then, when the user's hand gets apart from the knob part 41 of the door 4 under the condition shown in FIGS. 8A and 8B, the support part 40 of the upper door 4 is rotated inward of the housing 2 by the own weight of the door 4 and the knob part 41. The rotation of the support part 40 causes the connecting member 71 of the door 4 to cause the second body 74 to travel rearward. In this situation, each second guide-target part 82 of the second body 74 travels rearward under speed reduction by the viscous fluid between the second guide part 73 and the second guide-target part 82 of the second body 74, while being guided by the second guide part 73 at the first body 60 of the retracting action unit 6.

On the other hand, the connecting member 71 of the lower door 4 is caused by movement of the second guide-target part 82 of the second body 74 to rotate the support part 40 of the lower door 4 in the inward direction. Then, when the engaging part 68 of the second body 74 engages in the hole 69 of the action regulation board 67 at the first body 60, the upper and lower doors 4 are closed as shown in FIGS. 7A and 7B.

<Effects of Second Embodiment> As is clear from the foregoing description, the door opening and closing mechanism 1 according to the second embodiment produces similar effects as the door opening and closing mechanism 1 according to the first embodiment.

In particular, the configuration that the accommodation mechanism 5 according to the second embodiment does not include the second pulling member 62, the first speed reduction mechanism 11, the second speed reduction mechanism 12, the couplers 8, nor the engaging member 9, serves to reduce the number of components as compared with the door opening and closing mechanism 1 according to the first embodiment. This serves to significantly reduce the cost of manufacturing the opening and closing mechanism for the doors 4 and the cost of manufacturing the housing 2 including the opening and closing mechanism.

Furthermore, the configuration that the lower peripheral part of the upper door 4 of the pair of doors 4 is provided with the knob part 41, allows to operate the doors 4 naturally, and serves to improve the action of opening and closing the doors 4 because when the upper door 4 is drawn back from the housing 2, the weight of the knob part 41 acts on the upper door 4, and the knob part 41 swings.

Other Embodiments of the Present Invention

The present invention is not limited to the embodiments described above, but may be carried out with modifications within the scope of the patent claims. For example, the configuration that the pair of doors 4 are provided at the front side opening 20 of the housing 2 and configured to be caused by the door opening and closing mechanism 1 to perform the action of opening and closing, may be modified such that a single door 4 is configured to open and close the front side opening 20. This modification belongs to the present invention.

INDUSTRIAL APPLICABILITY

The door opening and closing mechanism 1 according to the present invention described above is effectively applicable to a control switchboard for electrical equipment, a control board accommodating a computer, etc.

The invention claimed is:
1. A door opening and closing mechanism comprising:
a door configured to open and close a front side opening of a housing, wherein an electronic device is housed in the housing and is exposed through the front side opening; and
an accommodation mechanism configured to accommodate the door in the housing when the door is in open state; wherein:
the accommodation mechanism includes;
an opening and closing action unit configured to cause an opening action and a closing action of the door; and
a retracting action unit configured to retract the opening and closing action unit into the housing so as to accommodate the door in the housing, when the door is brought in open state by the opening and closing action unit;
the retracting action unit includes:
a first body mounted in the housing, and configured to travel forward and rearward in a longitudinal direction of the housing;
a pulling member being extensible and contractible and configured to pull the first body rearward of the housing under a condition that the pulling member is connected to an inside of the housing; and
an action regulation part configured to regulate action of the opening and closing action unit; and
the opening and closing action unit includes:
a second body, wherein an action of the second body in the longitudinal direction is regulated by the action regulation part under a condition that the second body is mounted to the first body and configured to travel forward and rearward in the longitudinal direction with respect to the first body; and
a connecting member configured to be caused by movement of the second body to open and close the door under a condition that the connecting member is pivotally connected to the second body and the door.

2. The door opening and closing mechanism as claimed in claim 1, wherein:
the action regulation part includes:
an action regulation board mounted to the first body; and
an engaging part configured to engage with the action regulation board under a condition that the second body is provided with the engaging part;
the action regulation board is formed with a hole in which the engaging part is configured to engage;
the engaging part is configured to engage in the hole when the door is in closed state; and
the engaging part is configured to engage with a front side end portion of the action regulation board when the door is in open state.

3. The door opening and closing mechanism as claimed in claim 1, wherein:
an inner surface of the housing is provided with a first guide part, wherein the first guide part is configured to guide a guide-target part of the first body in the longitudinal direction, wherein viscous fluid is filled between the guide-target part of the first body and the first guide part for speed reduction of action of the first body in the longitudinal direction; and
the first body is provided with a second guide part, wherein the second guide part is configured to guide a guide-target part of the second body in the longitudinal direction, wherein viscous fluid is filled between the guide-target part of the second body and the second guide part for speed reduction of action of the second body in the longitudinal direction.

4. A door opening and closing mechanism comprising:
a door configured to open and close a front side opening of a housing, wherein an electronic device is housed in the housing and is exposed through the front side opening; and
an accommodation mechanism configured to accommodate the door in the housing when the door is in open state; wherein:
the accommodation mechanism includes:
an opening and closing action unit configured to cause an opening action and a closing action of the door; and
a retracting action unit configured to retract the opening and closing action unit into the housing so as to accommodate the door in the housing, when the door is brought in open state by the opening and closing action unit; and
the retracting action unit includes:
a first body mounted in the housing, and configured to travel forward and rearward in a longitudinal direction of the housing;
a first pulling member being extensible and contractible and configured to pull the first body rearward of the housing under a condition that the first pulling member is connected to an inside of the housing; and
a second pulling member being extensible and contractible and configured to pull the opening and closing action unit forward of the housing under a condition that the second pulling member is connected to first body.

5. The door opening and closing mechanism as claimed in claim 4, wherein the opening and closing action unit includes:
a second body connected to the second pulling member under a condition that the second body is mounted to the first body and configured to travel forward and rearward in the longitudinal direction with respect to the first body; and
a connecting member configured to be caused by movement of the second body to open and close the door under a condition that the connecting member is pivotally connected to the second body and the door.

6. The door opening and closing mechanism as claimed in claim 4, further comprising a first speed reduction mechanism configured to reduce speed of action of the first body.

7. The door opening and closing mechanism as claimed in claim 6, wherein the first speed reduction mechanism includes:
a first rotary speed reduction part provided at the first body; and
a first receiving part formed with a toothed surface that extends in the longitudinal direction, and is configured to mesh with the first rotary speed reduction part under a condition that the first receiving part is provided at an inside of the housing.

8. The door opening and closing mechanism as claimed in claim 5, further comprising a second speed reduction mechanism configured to reduce speed of action of the second body.

9. The door opening and closing mechanism as claimed in claim 8, wherein the second speed reduction mechanism includes:

a second rotary speed reduction part provided at the second body; and
a second receiving part formed with a toothed surface that extends in the longitudinal direction, and is configured to mesh with the second rotary speed reduction part under a condition that the second receiving part is provided at the first body.

10. The door opening and closing mechanism as claimed in claim 4, further comprising a pair of couplers configured to couple the retracting action unit with the opening and closing action unit under a condition that the door is in closed state, wherein the retracting action unit is provided with a first one of the couplers, the opening and closing action unit is provided with a second one of the couplers, and the first coupler is configured to be attached to and detached from the second coupler by receipt of pressure from the second coupler.

11. The door opening and closing mechanism as claimed in claim 5, further comprising an engaging member configured to: engage the first body with an inside of the housing when the first body arrives at a forward travel end position in the longitudinal direction; and disengage the first body from the inside of the housing when the second body arrives at a position where the door is in open state.

12. The door opening and closing mechanism as claimed in claim 1, wherein the door is provided for each of upper and lower sides of the front side opening of the housing.

13. The door opening and closing mechanism as claimed in claim 1, wherein:
the door is provided for each of upper and lower sides of the front side opening of the housing; and
the door for the upper side includes a lower peripheral part where a knob part rotatably provided.

14. A door opening and closing mechanism comprising:
a door configured to open and close a front side opening of a housing, wherein an electronic device is housed in the housing and is exposed through the front side opening; and
an accommodation mechanism configured to accommodate the door in the housing when the door is in open state; wherein:
the accommodation mechanism includes:
an opening and closing action unit configured to cause an opening action and a closing action of the door; and
a retracting action unit configured to retract the opening and closing action unit into the housing so as to accommodate the door in the housing, when the door is brought in open state by the opening and closing action unit;
the retracting action unit includes:
a first body mounted in the housing, and configured to travel forward and rearward in a longitudinal direction of the housing;
a pulling member being extensible and contractible and configured to pull the first body rearward of the housing under a condition that the pulling member is connected to an inside of the housing; and
an action regulation part configured to regulate action of the opening and closing action unit;
the door is provided for each of upper and lower sides of the front side opening of the housing; and
the door for the upper side includes a lower peripheral part where a knob part rotatably provided.

* * * * *